US010361091B2

(12) United States Patent
Hudson et al.

(10) Patent No.: US 10,361,091 B2
(45) Date of Patent: Jul. 23, 2019

(54) POROUS LOW-K DIELECTRIC ETCH

(71) Applicant: Lam Research Corporation, Fremont, CA (US)

(72) Inventors: Eric Hudson, Berkeley, CA (US); Shashank Deshmukh, San Ramon, CA (US); Sonny Li, Fremont, CA (US); Chia-Chun Wang, Fremont, CA (US); Prabhakara Gopaladasu, Fremont, CA (US); Zihao Ouyang, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/610,159

(22) Filed: May 31, 2017

(65) Prior Publication Data

US 2018/0350618 A1 Dec. 6, 2018

(51) Int. Cl.
*H01L 21/02* (2006.01)
*H01L 21/311* (2006.01)
*H01L 21/3065* (2006.01)
*H01L 21/302* (2006.01)
*H01L 21/461* (2006.01)

(52) U.S. Cl.
CPC .... *H01L 21/31116* (2013.01); *H01L 21/3065* (2013.01); *H01L 21/0212* (2013.01)

(58) Field of Classification Search
CPC .......... H01L 21/31116; H01L 21/3065; H01L 21/31144; H01L 21/0212; H01L 21/02274
USPC ...... 216/267, 37, 58; 257/E21.218, E21.252, 257/E21.257; 438/710, 703, 730
See application file for complete search history.

(56) References Cited

U.S. PATENT DOCUMENTS 8,608,973 B1 * 12/2013 Guha ................. C23F 4/00
216/67
9,779,956 B1 * 10/2017 Zhang ............... H01L 21/31116
2005/0048789 A1 * 3/2005 Merry ................ H01L 21/0332
438/723

(Continued)

OTHER PUBLICATIONS

International Search Report from International Application No. PCT/US2018/032584 dated Aug. 24, 2018.

(Continued)

*Primary Examiner* — Nduka E Ojeh
(74) *Attorney, Agent, or Firm* — Beyer Law Group LLP

(57) ABSTRACT

A method for etching features into a porous low-k dielectric etch layer is provided. A plurality of cycles is performed in a plasma processing chamber. Each cycle comprises a deposition phase and an activation phase. The deposition phase comprises flowing a deposition gas comprising a fluorocarbon and/or hydrofluorocarbon gas, creating a plasma in the plasma processing chamber using the deposition gas, depositing a fluorocarbon or hydrofluorocarbon containing layer, and stopping the flow of the deposition gas. The activation phase comprises flowing an activation gas comprising a noble gas and a carbon etching additive, creating a plasma in the plasma processing chamber using the activation gas, providing an activation bias in the plasma processing chamber, wherein the activation bias causes the etching of the low-k dielectric layer, with consumption of the fluorocarbon or hydrofluorocarbon containing layer, and stopping the flow of the activation gas.

17 Claims, 7 Drawing Sheets

(56) References Cited

U.S. PATENT DOCUMENTS

| | | |
|---|---|---|
| 2007/0238305 A1 | 10/2007 | Delgadino et al. |
| 2010/0285671 A1* | 11/2010 | Ji ............................ G03F 7/427 |
| | | 438/723 |
| 2013/0105303 A1* | 5/2013 | Lubomirsky ..... H01J 37/32357 |
| | | 204/192.34 |
| 2013/0203256 A1* | 8/2013 | Xu .................... H01L 21/30655 |
| | | 438/694 |
| 2015/0017809 A1 | 1/2015 | Bhowmick et al. |
| 2015/0083580 A1 | 3/2015 | Shimizu et al. |

OTHER PUBLICATIONS

Written Opinion from International Application No. PCT/US2018/032584 dated Aug. 24, 2018.

* cited by examiner

POROUS LOW-K DIELECTRIC ETCH

BACKGROUND OF THE INVENTION

Field of the Invention

The invention relates to a method of forming semiconductor devices on a semiconductor wafer. More specifically, the invention relates to etching porous low-k dielectric layers in the formation of semiconductor devices.

In forming semiconductor devices, a porous low-k dielectric layer may be etched.

SUMMARY OF THE INVENTION

To achieve the foregoing and in accordance with the purpose of the present disclosure, a method for etching features into a porous low-k dielectric etch layer disposed below a patterned mask is provided. A plurality of cycles is performed in a plasma processing chamber. Each cycle comprises a deposition phase and an activation phase. The deposition phase comprises flowing a deposition gas comprising a fluorocarbon and/or hydrofluorocarbon gas into the plasma processing chamber, creating a plasma in the plasma processing chamber using the deposition gas, depositing a fluorocarbon or hydrofluorocarbon containing layer on the low-k dielectric etch layer, and stopping the flow of the deposition gas into the plasma processing chamber. The activation phase comprises flowing an activation gas comprising a noble gas and a carbon etching additive, into the plasma processing chamber, creating a plasma in the plasma processing chamber using the activation gas, providing an activation bias in the plasma processing chamber, wherein the activation bias causes the etching of the low-k dielectric layer, with consumption of the fluorocarbon or hydrofluorocarbon layer, and stopping the flow of the activation gas into the plasma processing chamber.

In another manifestation, a method for etching features into a porous low-k dielectric etch layer disposed below a patterned mask is provided. A plurality of cycles is provided in a plasma processing chamber, where each cycle comprises a deposition phase, an activation phase, and a flashing phase. The deposition phase comprises flowing a deposition gas comprising a fluorocarbon and/or hydrofluorocarbon gas into the plasma processing chamber, creating a plasma in the plasma processing chamber using the deposition gas, depositing a fluorocarbon or hydrofluorocarbon containing layer on the low-k etch layer, and stopping the flow of the deposition gas into the plasma processing chamber. The activation phase comprises flowing an activation gas comprising a noble gas, into the plasma processing chamber, creating a plasma in the plasma processing chamber using the activation gas, providing an activation bias in the plasma processing chamber, wherein the activation bias causes activation of a fluorine component of the fluorocarbon or hydrofluorocarbon containing layer, which causes the low-k dielectric etch layer to be etched, wherein a carbon containing layer remains on the low-k dielectric layer, and stopping the flow of the activation gas into the plasma processing chamber. The flashing phase comprises flowing a flashing gas comprising a carbon removal gas into the plasma processing chamber, where the carbon removal gas comprises at least one of COS, $SO_2$, H2S, NO, $NO_2$, $NO_3$, $N_2O_3$, $NH_3$, $PH_3$, $CO_2$, $N_2$, $O_2$, CO, $H_2O$, or $H_2$, creating a plasma in the plasma processing chamber using the flashing gas, which removes the carbon containing layer; and stopping the flow of the flashing gas into the plasma processing chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
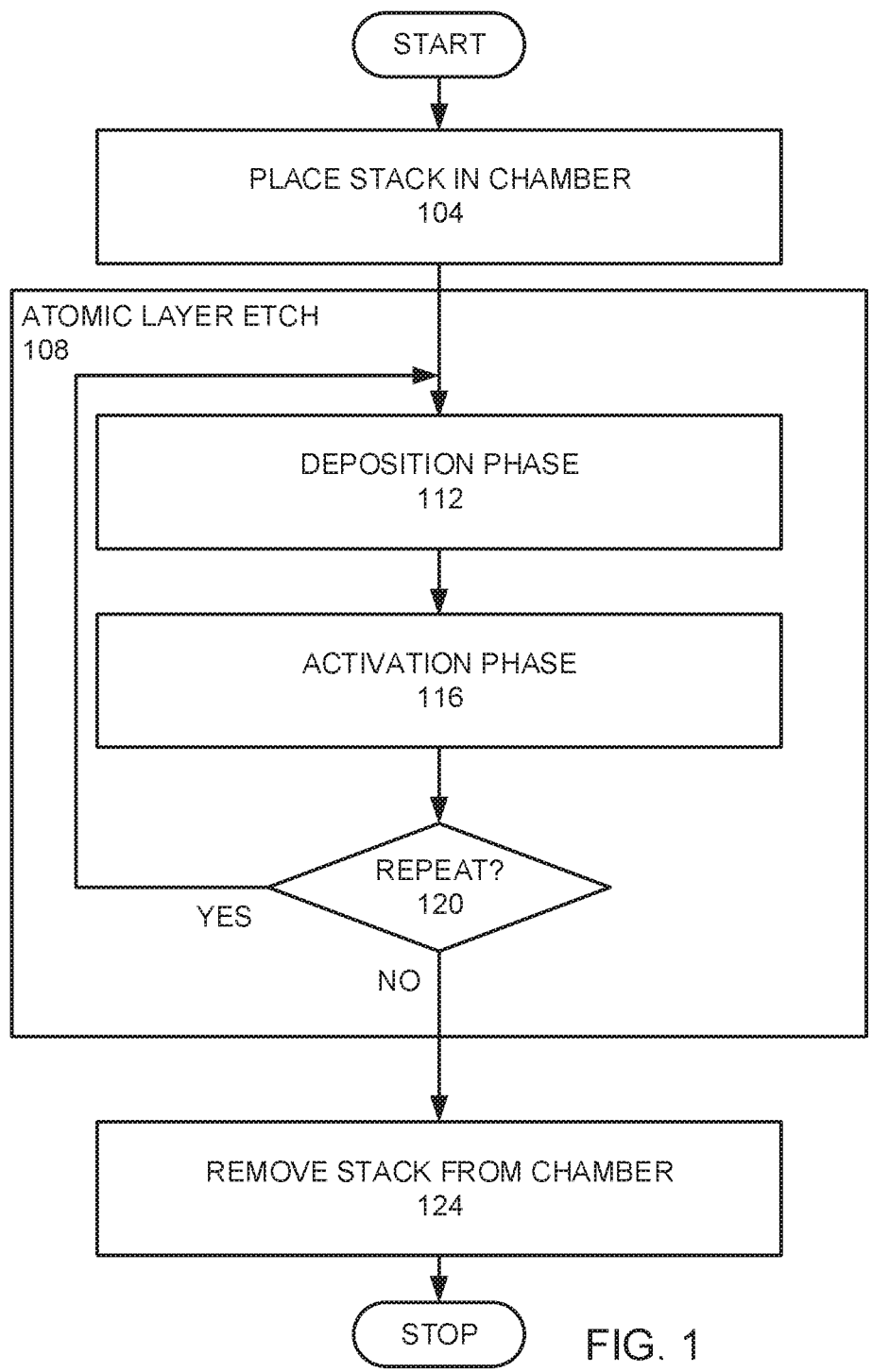
FIG. 1 is a high level flow chart of an embodiment of the invention.

FIG. 1 is a high level flow chart of an embodiment. In this embodiment, a stack is placed in an etch chamber (step 104). Preferably, the stack has porous low-k dielectric layer disposed below a patterned mask. In the specification and claims, a porous low-k dielectric layer has a dielectric constant k<3.0. The porous low-k dielectric layer is etched using an atomic layer etch (step 108). Such an etch involves a cyclical process. In each cycle, a fluorocarbon and/or hydrofluorocarbon layer is deposited (step 112). The deposited layer is then activated, in a step which combines a carbon etchant and energetic ion activation. This activates the fluorine which etches the silicon of the porous low-k dielectric layer, while the carbon etchant prevents buildup of excess carbon at the etched surface. (step 116). A determination is made whether to repeat the cycle (step 120). The stack is removed from the chamber (step 124).

EXAMPLE

Figure 2A:
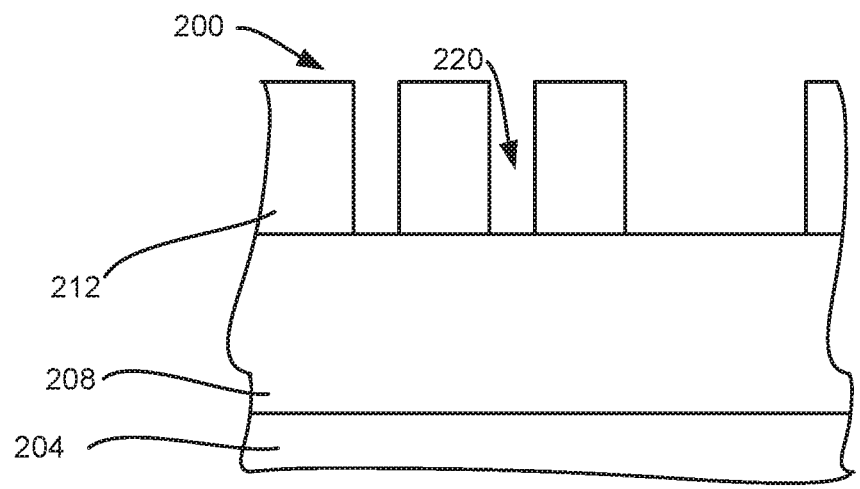
FIGS. 2A-D are schematic cross-sectional views of a stack processed according to an embodiment of the invention.

In a preferred embodiment of the invention, a stack with a porous low-k dielectric etch layer disposed below a patterned mask is placed in an etch chamber (step 104). FIG. 2A is a schematic cross-sectional view of a stack 200 with a substrate 204 with a porous low-k dielectric etch layer 208 disposed below a patterned mask 212. In this example, one or more layers may be disposed between the substrate 204 and the porous low-k dielectric etch layer 208, or the porous low-k dielectric etch layer 208 and the patterned mask 212. In this example, the patterned mask 212 is TiN, and the porous low-k dielectric etch layer 208 is a silicon oxide based dielectric with added organic components of carbon and hydrogen, such as Black Diamond II®, produced by Applied Materials®. Other embodiments may use other key mask materials, such as spin-on organic mask layer and α-C, amorphous carbon (ACL). In this example, mask pattern features 220 have been formed in the patterned mask 212. In some embodiments, the mask pattern features 220 are formed before the stack 200 is placed in the chamber. In other embodiments, the mask pattern features 220 are formed while the stack 200 is in the chamber. As shown, some mask pattern features 220 may be wider than other mask pattern features 220. The width is not the only factor that affects shading—the shape of the hole also matters. In this example, one mask pattern feature 220 is several times wider than another mask pattern feature 220.

Figure 3:
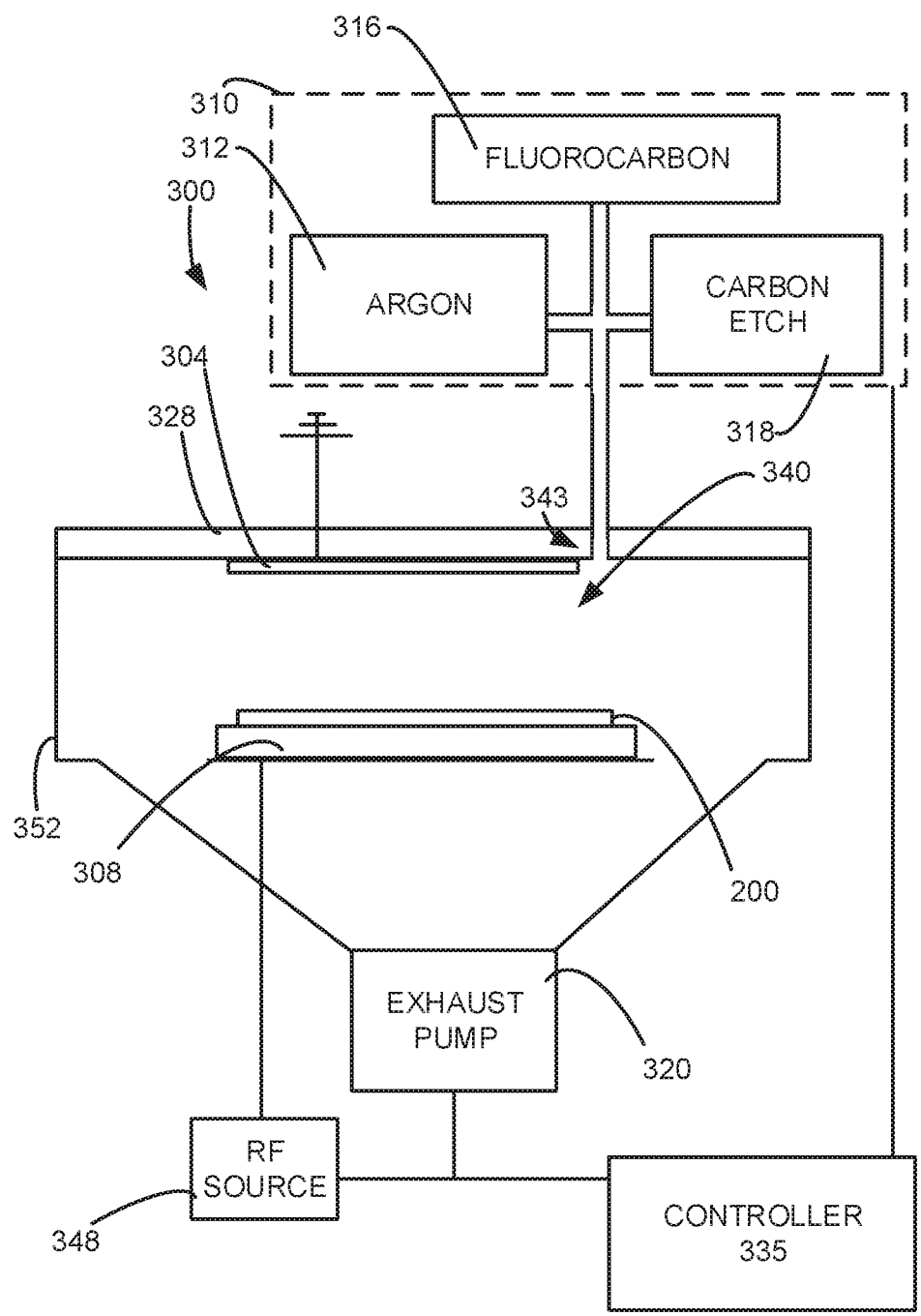
FIG. 3 is a schematic view of a plasma processing chamber that may be used in an embodiment of the invention.

FIG. 3 is a schematic view of a plasma processing chamber 300 that may be used for one or more of the following steps. The plasma processing chamber 300 comprises an upper electrode 304, a lower electrode 308, a gas source 310, and an exhaust pump 320. Within plasma processing chamber 300, the stack is positioned upon the lower electrode 308. The lower electrode 308 incorporates a suitable substrate chucking mechanism (e.g., electrostatic, mechanical clamping, or the like) for holding the stack 200. The reactor top 328 incorporates the upper electrode 304 disposed immediately opposite the lower electrode 308. The upper electrode 304 and lower electrode 308 define the confined plasma volume 340. Gas is supplied to the confined plasma volume 340 through a gas inlet 343 by the gas source 310 and is exhausted from the confined plasma volume 340 through an exhaust port by the exhaust pump 320. Besides helping to exhaust the gas, the exhaust pump 320 helps to regulate pressure. In this embodiment, the gas source 310 comprises an argon gas source 312, a fluorocarbon containing gas source 316, and a carbon etch gas source 318. The gas source 310 may further comprise other gas sources. An RF source 348 is electrically connected to the lower electrode 308. Chamber walls 352 surround the upper electrode 304, and the lower electrode 308. Different combinations of connecting RF power to the electrode are possible. In a preferred embodiment, the 27 MHz, 60 MHz and 2 MHz power sources make up the RF power source 348 connected to the lower electrode 308, and the upper electrode 304 is grounded. A controller 335 is controllably connected to the RF source 348, exhaust pump 320, and the gas source 310. Preferably, the process chamber 300 is a CCP (capacitive coupled plasma) reactor, as shown. In other embodiments, an ICP (inductive coupled plasma) reactor or other sources like surface wave, microwave, or electron cyclotron resonance ECR may be used.

Figure 4:
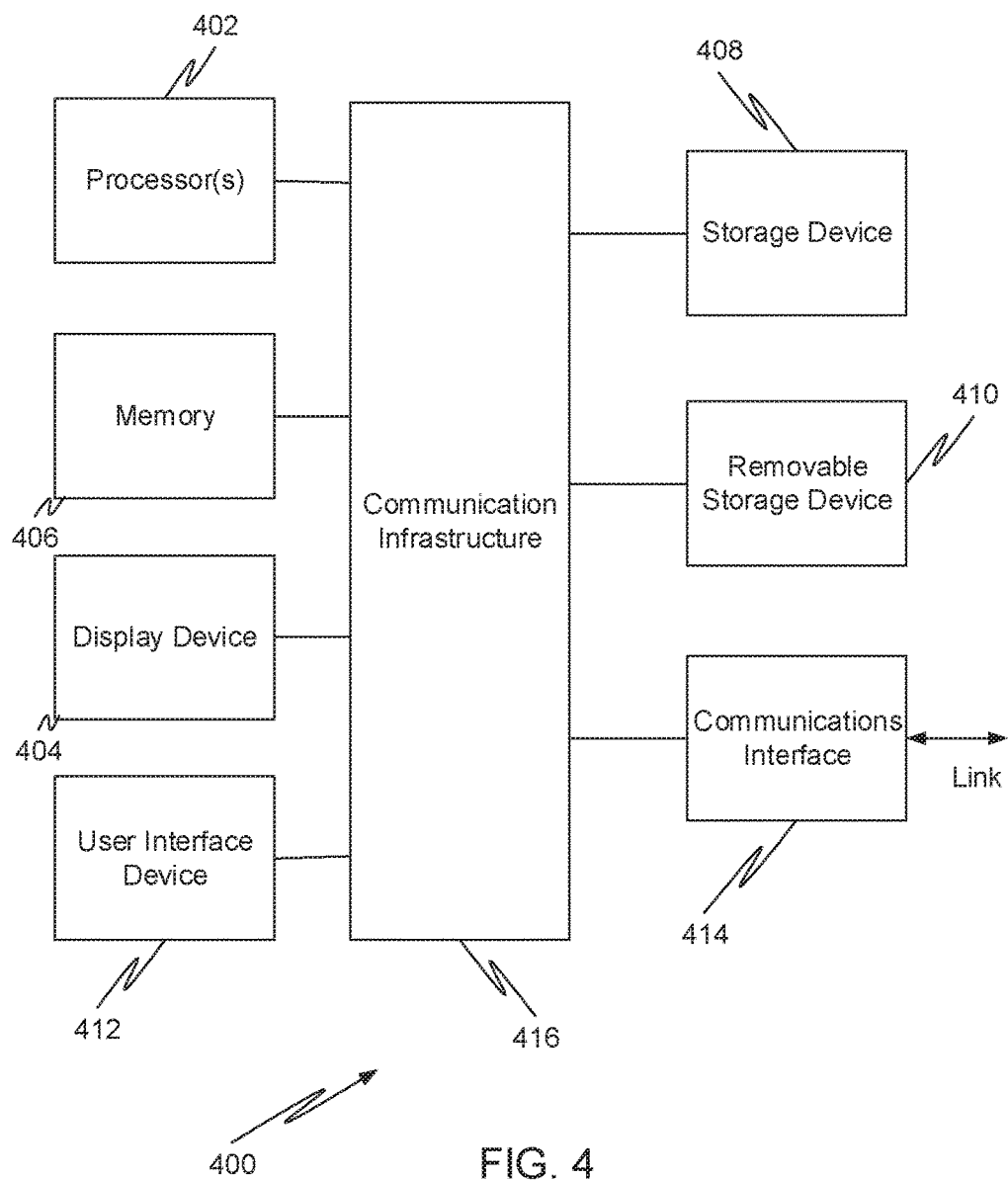
FIG. 4 is a schematic view of a computer system that may be used in practicing the invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
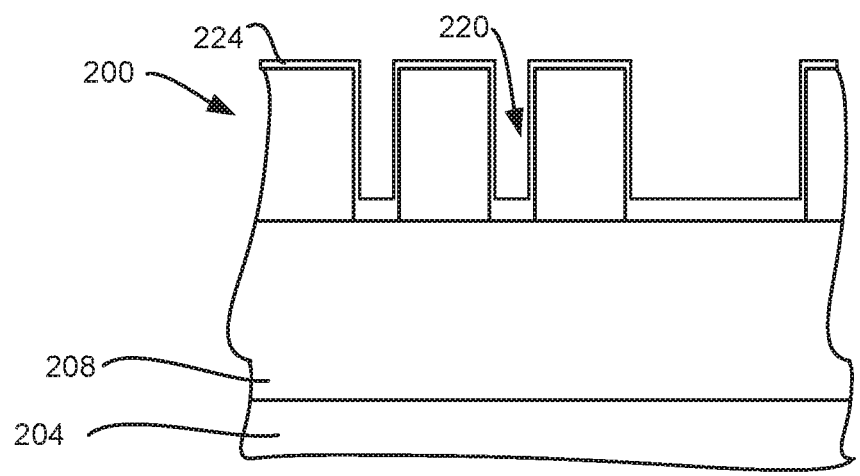
Figure 5:
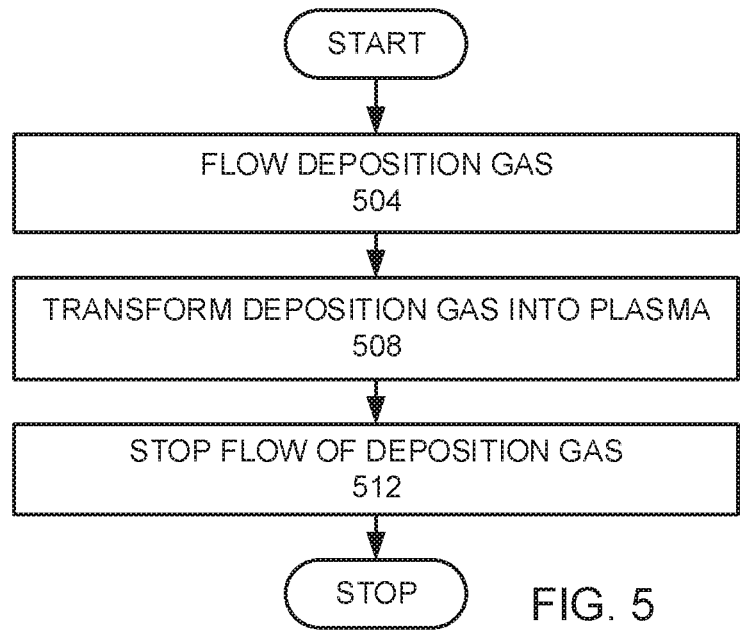
FIG. 5 is a more detailed flow chart of the step of depositing the fluorocarbon and/or hydrofluorocarbon layer.

After the stack 200 has been placed into the plasma processing chamber 300, the etch layer 208 is etched with an atomic layer etch (step 108). A fluorocarbon and/or hydrofluorocarbon layer is deposited (step 112). FIG. 5 is a more detailed flow chart of the step of depositing the fluorocarbon and/or hydrofluorocarbon layer (step 112). A deposition gas is flowed into the plasma processing chamber 300 (step 504). In this example, $C_4F_6$ is introduced at 2 sccm flow, mixed with 300 sccm of argon (Ar), at a pressure of 10 mTorr, and a wafer temperature 80° C. The deposition gas is transformed into a plasma (step 508). In this embodiment, 15-300 Watts of RF power is provided at 60 MHz, which transforms the deposition gas into a plasma. A bias ranging from −20V to −200V volts is provided. After 3 seconds, the flow of the deposition gas is stopped (step 512). FIG. 2B is a schematic cross-sectional view of the stack 200 after a fluorocarbon or hydrofluorocarbon containing layer 224 has been deposited. The deposition selectively deposits on horizontal surfaces with respect to vertical surfaces, so that the deposition on horizontal surfaces is thicker than the deposition on vertical surfaces. Preferably, the selectivity allows for little or no deposition on the vertical surfaces.

Figure 2C:
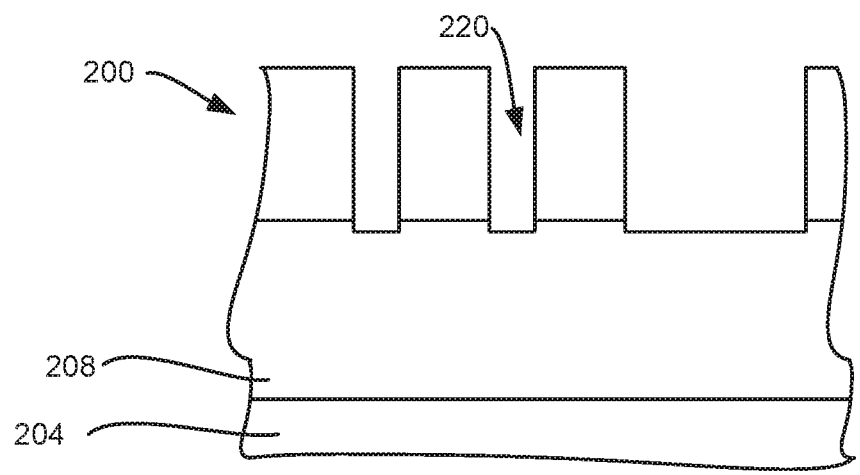
Figure 6:
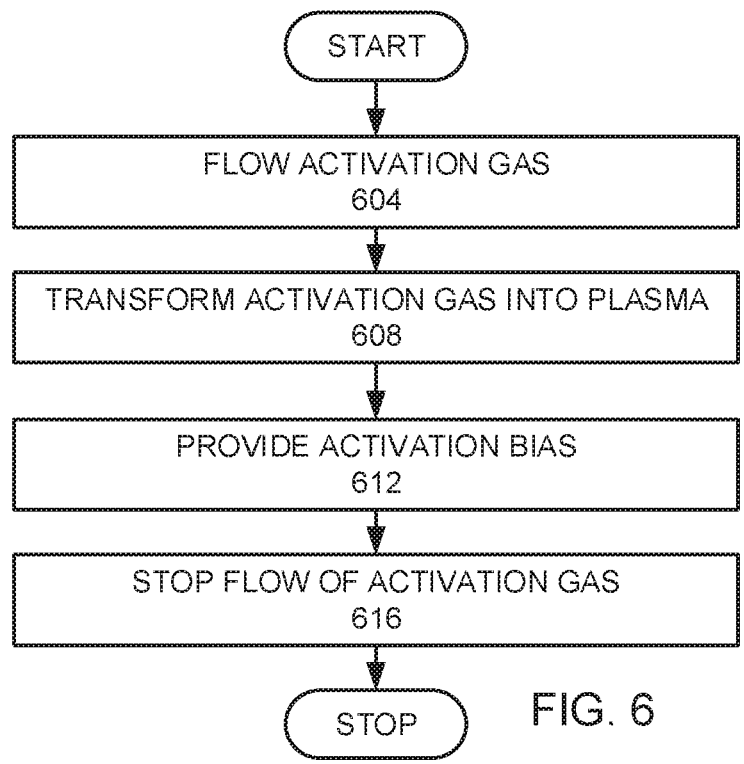
FIG. 6 is a more detailed flow chart of the step of activating the fluorine and providing a carbon etchant.

The deposited layer is then activated, which activates the fluorine and provides a carbon etchant, which etches the porous low-k dielectric layer (step 116). FIG. 6 is a more detailed flow chart of the step of activating the fluorine and providing a carbon etchant, which has the combined effect of etching the porous low-k dielectric layer (step 116). An activation gas is flowed into the plasma processing chamber 300 (step 604). In this example, the activation gas is 300 sccm Ar and 3 sccm $O_2$. A chamber pressure of 10 mTorr and a wafer temperature 80° C. is provided. The activation gas is transformed into a plasma (step 608). In this embodiment, 30-200 Watts of RF power is provided at 2 MHz and 30-300 Watts of RF power is provided at 60 MHz, which transforms the activation gas into a plasma. An activation bias ranging from −20V to −400V volts is provided (step 612). The activation bias is an electrical potential on substrate resulting from combination of RF power and plasma which causes ions to be accelerated from plasma to substrate. After 3 seconds, the flow of the activation gas is stopped (step 616). FIG. 2C is a schematic cross-sectional view of the stack 200 after a fluorocarbon or hydrofluorocarbon containing layer 224 has been activated. The fluorine in the deposited layer is activated, which etches the silicon of the porous low-k dielectric layer. The carbon etchant etches the carbon of the porous low-k dielectric layer and carbon remaining from the deposited layer. The deposited layer is complete removed and some of the porous low-k dielectric layer 208 is etched. The activation bias may have the undesirable effect of sputtering the etch mask. Excessive removal of the mask may cause loss of pattern fidelity. Preferential sputtering at the edges of the mask features may induce faceting and/or an increase in the space CD. These effects must be balanced against the benefits of activation bias in promoting the etch reaction and the carbon removal reaction.

Figure 2D:
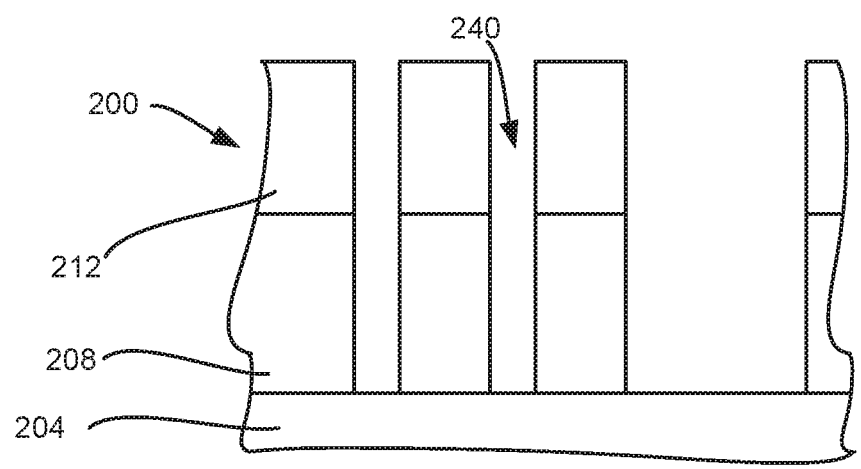

The etch cycle may then be repeated (step 120) as needed to increment the progress of the etch. Preferably, the cycle is repeated from 5 to 500 times. After the etch steps are performed for a plurality of cycles, the etch is completed. FIG. 2D is a schematic cross-sectional view of a stack 200 after the completed etching of features 240. The stack 200 may be subjected to additional processing before the stack 200 is removed from the plasma processing chamber 300.

This embodiment provides an etching of a porous low-k dielectric layer. Preferably, the porous low-k dielectric layer is a silicon oxide based layer with organic components, providing a layer of Si, O, C, and H. Without a carbon etching component, a carbon layer could continuously build up at the etch front surface and cause etch stop or in some other way be detrimental to the etch process. Preferably, the carbon etchant is at least one of $COS$, $SO_2$, $H_2S$, $NO$, $NO_2$, $NO_3$, $N_2O_3$, $NH_3$, $PH_3$, $CO_2$, $N_2$, $O_2$, $CO$, $H_2O$, or $H_2$. More preferably, the activation gas is halogen free. This embodiment is able to etch features with a CD of less than 20 nm with a height to width aspect ratio of at least 3:1. More preferably, the etch is able to etch features with a CD of less than 15 nm and provide height to width aspect ratios of at least 4:1. In order to etch features at such a low CD, sidewall deposition and carbon build up on the sidewalls should be minimized. In addition, the embodiment provides a high porous low-k dielectric to mask etch selectivity. Preferably, the selectivity for etching porous low-k dielectric with respect to the etch mask is greater than 10:1. Preferably, the noble gas is Ar. In other embodiments, the noble gas may be He, Ne, Kr, or Xe. Using He or Ne for the noble gas may provide different etch and/or sputtering qualities. This embodiment also provides good depth loading, where etch depth is uniform across different feature widths, shapes, and aspect ratios.

In various embodiments, the deposition gas comprises a fluorocarbon or a hydrofluorocarbon. The deposition gas may further comprise a diluent, which is inert and does not react with the porous low-k dielectric layer.

In embodiments where $N_2$ is added to Ar as the carbon etchant for the activation gas, it was found that $N_2$ improves mask preservation, likely due to a reduction of sputtering rate. It may be that $N_2+$ ions cause less sputtering than Ar+ ions. Preferably, bias during activation has a greater magnitude than bias during the deposition, since the activation process uses bias to produce energetic ions which bombard and activate the deposited layer. Preferably, the activation removes all of the fluorocarbon and/or hydrofluorocarbon layer.

Figure 7:
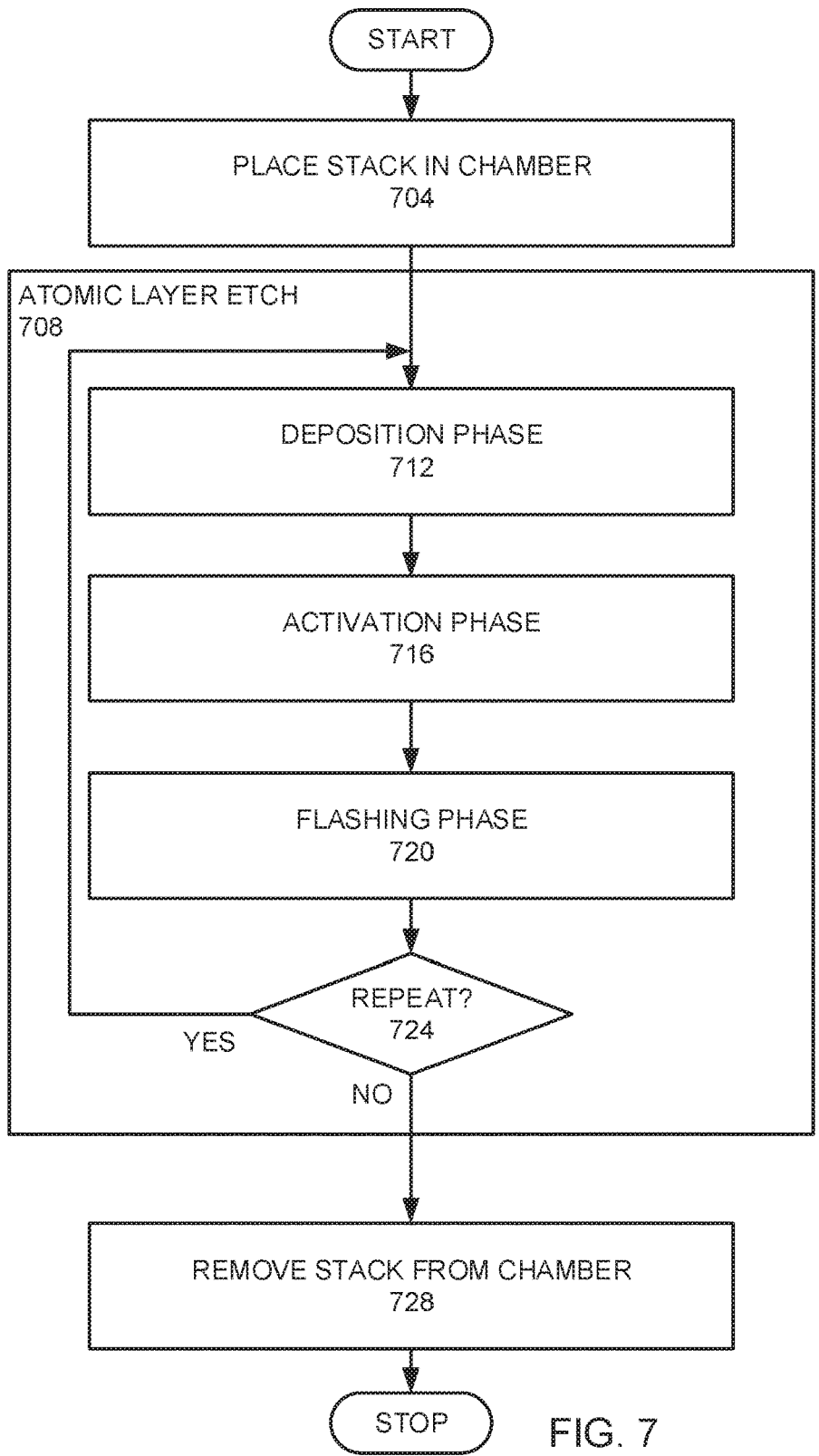
FIG. 7 is a flow chart of a process for another embodiment.

In another embodiment, the cyclical etch process may comprise a deposition step, an activation step, and a flashing step. FIG. 7 is a flow chart of a process for this embodiment. In this embodiment, a stack is placed in an etch chamber (step 704). The stack and etch chamber may be the same as in the previous embodiment. Preferably, the stack has porous low-k dielectric layer disposed below a patterned mask. The porous low-k dielectric layer is etched using an atomic layer etch (step 708). Such an etch involves a cyclical process. In each cycle, a fluorocarbon and/or hydrofluorocarbon layer is deposited (step 712). In an example of a recipe for this process, a deposition gas is flowed into the plasma processing chamber. In this example, $C_4F_6$ is introduced at 2 sccm flow, mixed with 300 sccm of argon (Ar), at a pressure of 10 mTorr, and a wafer temperature 80° C. The deposition gas is transformed into a plasma. In this embodiment, 15-300 Watts of RF power is provided at 60 MHz, which transforms the deposition gas into a plasma. A bias ranging from −20V to −200V volts is provided. After 3 seconds, the flow of the deposition gas is stopped.

The deposited layer is then activated, which activates the fluorine, which etches the porous low-k dielectric layer (step 716). An example of a recipe for this process provides an activation gas, which is flowed into the plasma processing chamber 300. In this example, the activation gas consists essentially of Ar. A chamber pressure of 10 mTorr and a wafer temperature 80° C. is provided. The activation gas is transformed into a plasma (step 608). In this embodiment, 30-200 Watts of RF power is provided at 2 MHz and 30-300 Watts of RF power is provided at 60 MHz, which transforms the activation gas into a plasma. An activation bias ranging from −20V to −400V volts is provided (step 612). After 3 seconds, the flow of the activation gas is stopped. Because the activation gas consists essentially of Ar, it is carbon etchant free. As a result, during this process a carbon layer may remain. The bias provided during this process causes activation by bombardment.

A flashing phase is provided to remove remaining carbon from the etch front surface (step 720). In an example recipe, a flashing gas comprising 3 sccm $O_2$ and a suitable diluent gas is flowed into the plasma processing chamber. The flashing gas is formed into a plasma. In this embodiment, 30-300 Watts of RF power is provided at 2 MHz and 30-300 Watts of RF power is provided at 60 MHz, which transforms the flashing gas into a plasma. A bias ranging from 15 to 400 volts is provided. After 3 seconds, the flow of the flashing gas is stopped. A determination is made whether to repeat the cycle (step 724). The stack is removed from the chamber (step 728).

In an embodiment, between two cycles the steps of providing a deposition phase and an activation phase may be provided without a flashing phase. In such an embodiment, the steps may provide phases in the order of a deposition phase, an activation phase, a flashing phase, a deposition phase, an activation phase, a deposition phase, an activation phase, and a flashing phase. In another embodiment, between two cycles of a deposition phase, activation phase, and flashing phase, more than one cycle of a deposition phase and activation phase without a flashing phase may be performed. Generally, various embodiments have at least two cycles of a deposition phase, an activation phase, and a flashing phase. Additional cycles of a deposition phase and an activation phase, without a flashing phase may be added. In addition, other steps or cycles may be added.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching features into a porous low-k dielectric etch layer disposed below a patterned mask, comprising performing a plurality of cycles in a plasma processing chamber, wherein each cycle comprises:
    a deposition phase, comprising:
        flowing a deposition gas comprising a fluorocarbon and/or hydrofluorocarbon gas into the plasma processing chamber;
        creating a plasma in the plasma processing chamber using the deposition gas;
        depositing a fluorocarbon or hydrofluorocarbon containing layer on the low-k dielectric etch layer; and
        stopping the flow of the deposition gas into the plasma processing chamber; and
    an activation phase, comprising:
        flowing an activation gas comprising a noble gas as a main component and a carbon etching additive into the plasma processing chamber such that the noble gas and the carbon etching additive are present in the plasma processing chamber at the same time;
        creating a plasma in the plasma processing chamber using the activation gas comprising the noble gas and the carbon etching additive;
        providing an activation bias in the plasma processing chamber in which the plasma is maintained, wherein the activation bias causes the etching of the low-k dielectric layer by the plasma, with consumption of the fluorocarbon or hydrofluorocarbon containing layer; and
        stopping the flow of the activation gas into the plasma processing chamber.

2. The method, as recited in claim 1, wherein the deposition gas further comprises a diluent.

3. The method, as recited in claim 2, wherein the porous low-k dielectric etch layer comprises silicon, oxygen, carbon, and hydrogen, wherein the activation phase removes components of the low-k dielectric layer including residual carbon and/or the fluorocarbon or hydrofluorocarbon containing layer.

4. The method, as recited in claim 3, wherein the carbon etching additive comprises at least one of COS, $SO_2$, $H_2S$, NO, $NO_2$, $NO_3$, $N_2O_3$, $NH_3$, $PH_3$, $CO_2$, $N_2$, $O_2$, CO, $H_2O$, or $H_2$.

5. The method, as recited in claim 4, wherein the noble gas is Ar gas.

6. The method, as recited in claim 5, wherein the features have a CD of less than 20 nm and a height to width aspect ratio of at least 3:1.

7. The method, as recited in claim 6, wherein the activation bias has a greater magnitude than bias during the deposition.

8. The method, as recited in claim 7, wherein the activation gas is halogen free.

9. The method, as recited in claim 1, wherein the fluorocarbon and/or hydrofluorocarbon gas comprises $C_4F_6$.

10. The method, as recited in claim 1, wherein the noble gas is at least one of He or Ne.

11. The method, as recited in claim 1, wherein the activation bias causes the activation of a fluorine component of the fluorocarbon or hydrofluorocarbon containing layer, which causes removal of a silicon component of the low-k dielectric etch layer and causes the activation of species from the carbon etching additive, which causes removal of a carbon component of the fluorocarbon or hydrofluorocarbon containing layer.

12. The method, as recited in claim 1, wherein the carbon etching additive comprises at least one of COS, $SO_2$, $H_2S$, NO, $NO_2$, $NO_3$, $N_2O_3$, $NH_3$, $PH_3$, $CO_2$, $N_2$, $O_2$, CO, $H_2O$, or $H_2$.

13. The method, as recited in claim 1, wherein the noble gas is Ar gas.

14. The method, as recited in claim 1, wherein the features have a CD of less than 20 nm and a height to width aspect ratio of at least 3:1.

15. The method, as recited in claim 1, wherein the activation bias has a greater magnitude than bias during the deposition.

16. The method, as recited in claim 1, wherein the activation gas is halogen free.

17. A method for etching features into a porous low-k dielectric etch layer disposed below a patterned mask, comprising performing a plurality of cycles in a plasma processing chamber,
    wherein each cycle comprises:
        a deposition phase, comprising:
            flowing a deposition gas comprising a fluorocarbon and/or hydrofluorocarbon gas into the plasma processing chamber;
            creating a plasma in the plasma processing chamber using the deposition gas;
            depositing a fluorocarbon or hydrofluorocarbon containing layer on the low-k dielectric etch layer; and
            stopping the flow of the deposition gas into the plasma processing chamber; and
        an activation phase, comprising:
            flowing an activation gas comprising a noble gas as a main component and a carbon etching additive into the plasma processing chamber such that the noble gas and the carbon etching additive are present in the plasma processing chamber at the same time;
            creating a plasma in the plasma processing chamber using the activation gas comprising the noble gas and the carbon etching additive;
            providing an activation bias in the plasma processing chamber in which the plasma is maintained, wherein the activation bias causes the etching of the low-k dielectric layer by the plasma, with consumption of the fluorocarbon or hydrofluorocarbon containing layer; and
            stopping the flow of the activation gas into the plasma processing chamber,
    wherein the porous low-k dielectric etch layer comprises silicon oxide, carbon, and hydrogen, wherein the activation phase removes components of the low-k dielectric layer including carbon.

* * * * *